United States Patent [19]
Iovdalsky et al.

[11] Patent Number: 6,002,147
[45] Date of Patent: Dec. 14, 1999

[54] HYBRID MICROWAVE-FREQUENCY INTEGRATED CIRCUIT

[75] Inventors: Viktor Anatolievich Iovdalsky; Eduard Volfovich Aizenberg; Vladimir Iliich Beil; Mikhail Ivanovich Lopin, all of Fryazino, Russian Federation

[73] Assignee: Samsung Electronics Company, Rep. of Korea

[21] Appl. No.: 09/077,402

[22] PCT Filed: Sep. 26, 1996

[86] PCT No.: PCT/RU96/00278

§ 371 Date: May 26, 1998

§ 102(e) Date: May 26, 1998

[87] PCT Pub. No.: WO98/13876

PCT Pub. Date: Apr. 2, 1998

[51] Int. Cl.$^6$ .......................... H01L 29/80; H01L 31/112; H01L 29/861; H01L 23/34

[52] U.S. Cl. .......................... 257/276; 257/275; 257/482; 257/604; 257/625; 257/728

[58] Field of Search ..................... 257/275, 276, 257/482, 604, 624, 625, 728

[56] References Cited

U.S. PATENT DOCUMENTS 3,986,196  10/1976  Decker et al. .......................... 257/276
5,614,743   3/1997  Mochizuki .............................. 257/276

*Primary Examiner*—Mahshid Saadat
*Assistant Examiner*—Allan R. Wilson
*Attorney, Agent, or Firm*—Rudnick & Wolfe

[57] ABSTRACT

The microwave hybrid integrated circuit comprises a dielectric board (1) provided with a topological metallization pattern (2) on its face side, a shield grounding metallization (3) on the back side thereof, a hole (4), and a metal base (5) having a projection (6). The hole (4) in the board (1) has a constriction (9) situated at a height of 1 to 300 μm from the face surface of the board (1). The projection (6) is located in a wide section (10) of the hole (4). Bonding pads (8) of a chip (7) which are to be grounded are electrically connected to the projection (6) through the constricted portion (9) of the hole (4) which is filled with an electrically and heat conducting material (11). The wide section (10) of the hole (4) is from 0.2×0.2 mm to the size of the chip (7), and the distance between the side walls of the projection (6) and the side walls of the wide section (10) of the hole (4) is 0.001 to 1.0 mm.

3 Claims, 1 Drawing Sheet

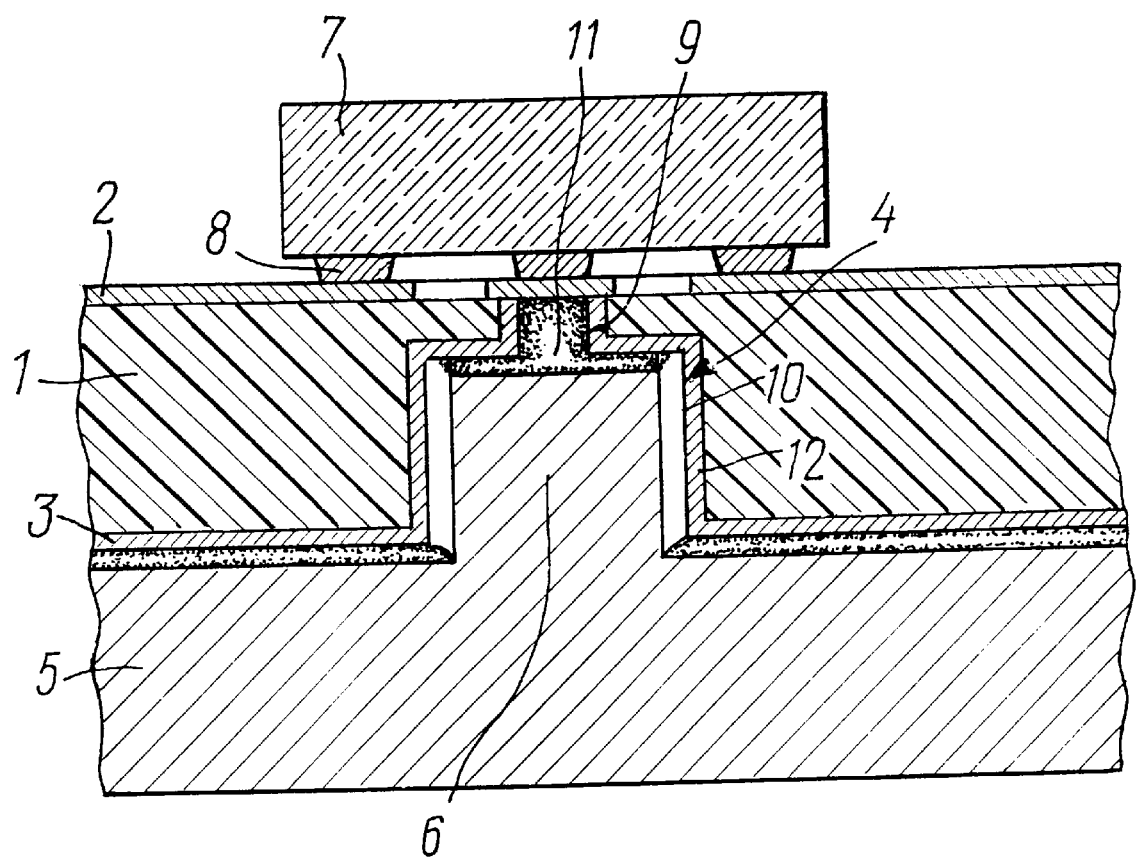

HYBRID MICROWAVE-FREQUENCY INTEGRATED CIRCUIT

FIELD OF THE INVENTION

The present invention relates in general to electronic engineering and more specifically to a microwave hybrid integrated circuit (IC).

BACKGROUND OF THE INVENTION

A microwave hybrid IC is known, which IC comprises a multilayer printed circuit board with a flat flexible insulating layer on which a number of conductive contacts are made for connection to the leads of the modular circuit components or to the holder. Interconnections between the contacts are attained by means of conductive jumpers arranged in a single or several planes inside the multilayer printed circuit board at the places of installation of modules or holders of the circuit components. A number of holes are made in the flexible dielectric material. A separate rigid metal element serves to withdraw the heat from the circuit components. Said element is superimposed on the board in such a manner that the heat conducting metal projections entered the holes to get in touch with the modules or holders of the circuit components. Additionally, one or more rigid elements made also of a heat conducting material may be applied to the upper portion of the circuit components. Clamps are used to provide the contact between the metal projections and the circuit components.

Flexibility of the multilayer structure prevents the concentration of mechanical stresses resulted from difference between thermal expansion coefficient values of the multilayer structure and circuit components. The multilayer structure can be bent between the modules or holders, which betters the contact between the projections and the circuit components and minimizes the danger of tearing the latter off the board surface (GB, A 2,129,223).

However, the aforecited hybrid IC is possessed of unsufficiently high weight-size and electrical characteristics.

Known in the art is a face-down semiconductor device, wherein metal cylindrical projected leads are formed on the chip. The chip surface except for the leads is coated with a layer of an insulating resin having a thickness equal to the height of leads. Chip-to-carrier bonding is effected using a solder filled up the lead cavity (JP, A, 57-57303).

The aforecited semi conductor device is possessed of low electrical parameters when used in the microwave range, which is due to the presence of large-area contact pads, e.g., 100×100 µm, and, respectively large chips, e.g. more than 1×1 mm, whereas the most widespread chips in the microwave technique are those which sizes being of 0.5×0.5 mm (or from 1×1 to 0.08×0.08 mm), having contact pads, e.g., from 0.03×0.03 to 0.015×0.015 mm which is concerned with a trend towards a minimized spurious inductance.

Moreover, making a projection on the metal base having the size approximating that of the contact pad, and its accurate mounting in the board hole involves some difficulties, especially in the case of small-size chips.

SUMMARY OF THE INVENTION

The principal object of the present invention is to provide a microwave hybrid integrated circuit having such a constructive arrangement that ensures to enhanced electrical and heat-dissipating characteristics, an extended operating frequency range of the circuit, and reduced laboriousness of its manufacturing process.

The foregoing object is accomplished due to the fact that in a microwave hybrid IC, comprising a dielectric board provided with a topological metallization pattern on its face side, a shield grounding metallization on the back side thereof, and a hole, the metal base joined with the shield grounding metallization and having a projection located in the hole of the board, a naked semiconductor chip positioned with its bonding pads towards the board face surface, a portion of the bonding pads are electrically connected to the topological metallization pattern, while another portion of the bonding pads to be grounded are electrically connected to the projection of the metal base, according to the invention, the hole in the board has a constriction situated at a height of 1 to 300 µm from the face surface of the board, the projection of the metal base is placed in the wide section of the hole, the chip bonding pads to be grounded are electrically connected to the metal base projection through the constricted hole section which is filled with an electrically and heat conducting material, the wide hole section is from 0.2×0.2 mm to the chip size, and the distance between the side walls of the projection and the side walls of the wide hole section is 0.001 to 1.0 mm.

The hole in the board may be metallized.

It is expedient that the space confined between the side walls of the projection and the side walls of the hole is filled with an electrically and heat conducting material.

Providing the hole constriction towards the board face surface enables to make the output of the grounding contact on the board surface to be commensurable with the dimensions of the bonding pads to be grounded, that is having low spurious parameters and small area, whereby the electrical and weight-size characteristics can be improved.

Providing the hole wide section and locating the electrically and heat conducting metal base in the projection ensures a better grounding quality and brings the heat conducting base to the most heated chip area, namely, its face surface in the zone of, e.g., the gate of a field-effect transistor, or p-n junctions of a bipolar transistor, thus improving the heat-dissipating characteristics of the circuit.

Connecting the chip bonding pads to the projection of the base through the constriction of the hole filled with an electrically and heat conducting material ensures a good electric and heat contact and hence improves the electrical and heat-dissipating characteristics of the circuit.

The minimum height of the hole constriction is limited to a minimum possible board thickness, while the maximum height of the hole is selected from the conditions of a minimum spurious inductance of the connection. Limiting the distance between the side walls of the projection and the side walls of the hole allows to reduce the requirements to the manufacturing and hole-to-projection aligning accuracy, thereby enhancing the manufacturability of the circuit.

BRIEF DESCRIPTION OF THE DRAWINGS

The present invention is illustrated by a detailed description of a specific exemplary embodiment thereof to be taken with reference to the accompanying drawing, wherein a sectional view of the filed microwave hybrid integrated circuit is represented.

BEST METHOD OF CARRYING OUT THE INVENTION

The microwave hybrid IC, according to the invention, comprises a 0.5 mm thick dielectric board 1 made of, e.g., Polycor and provided with a topological metallization pattern 2 on the face side thereof and with a shield grounding metallization 3 on its back side. The composition of the metal coating may be, e.g., as follows: Ti (100 Ohm/sq.mm)—Pd (0.2 μm)—Au (3 μm). The board 1 has a hole 4.

A metal base 5 is joined with the shield grounding metallization 3 by, e.g. a eutectic Au—Si solder. The base 5 has a projection 6 of, e.g., 0.5×0.5×0.4 mm located in the hole 4 of the board 1, the wide section of the hole 4 is of, e.g., 0.8×0.8×0.4 mm and the constricted section thereof is of 0.15×0.4×0.1 mm.

A naked semiconductor chip 7, e.g., the 3II603E-5 transistor of 0.5×0.45×0.3 mm is mounted so that its bonding pads 8 each of 60×60 μm face towards the face surface of the board 1, a portion of the pads 8 being electrically connected to the topological metallization pattern 2, and a portion of the pads to be grounded being electrically connected to the projection 6. The hole 4 in the board 1 has a constriction 9 situated at the face surface of the board 1. The projection 6 of the metal base 5 is located in a wide section 10 of the hole 4. The bonding pads 8 of the chip 7 which are to be grounded are electrically connected to the metal projection 6 of the base 5 through the constriction 9 of the hole 4, said constriction being filled with an electrically and heat conducting material 11, e.g., an (Au—Si) solder. The constriction 9 of the hole 4 is 0.1 mm long, and the spacing between the side walls of the projection 6 and the side walls of the wide section 10 of the hole 4 equals 0.15 mm.

The hole 4 in the board 1 is metallized (Ref No. 12), the composition of the metallization being, e.g., Pd—Ni (0.2 μm)—Cu (3 μm)—Ni (0.6 μm)—Au (2 μm).

The microwave hybrid integrated circuit, according to the invention, functions as follows.

A signal is applied to the input of the semiconductor chip 7 and undergoes an appropriate conversion, whereupon the converted signal is taken from the circuit output. Additionally, a quality grounding with low spurious parameters and an adequate heat dissipation through metallization of the hole, the electrically and heat conducting material filling the hole, the projection of the base, and the base itself are ensured.

The filed hybrid microwave integrated circuit enables its electrical parameters to be improved due to establishing electrical connections between the chip bonding pads to be grounded and the base projection, which ensures low spurious parameters, while providing the better heat dissipation from the most heated chip portion, and enhances the manufacturability of the circuit due to reduced requirements on accuracy in manufacturing the hole and projection and their aligning during the assembling procedure.

In describing the disclosed embodiment of the present invention, specific narrow terminology is used for the sake of clarity. However, the invention is not restricted to the specific terms so selected, and it should be understood that each such term covers all equivalent elements functioning in a similar way and used for solving similar problems.

Although the present invention has been described herein with reference to the preferred embodiment, it will be understood that various modifications and alterations may occur to the details of construction without departing from the spirit and scope of the invention, as will be readily understood by those skilled in the art.

All these modifications and alterations should be considered to remain within the limits of the spirit and scope of the invention and the claims that follow.

Industrial Applicability

The present invention can be used in semiconductor microelectronics.

We claim:

1. A microwave hybrid integrated circuit, comprising a dielectric board (1) provided with a topological metallization pattern (2) on a face side of the board (1), a shield grounding metallization (3) on a back side of the board (1), and a hole (4), a metal base (5) joined with the screen grounding metallization (3) of the board (1) and having a projection (6) located in the hole (4) in the board (1), a naked semiconductor chip (7), positioned with its bonding pads (8) towards the face surface of the board (1), a portion of the bonding pads (8) are electrically connected to the topological metallization pattern (2), while another portion of the bonding pads to be grounded, are electrically connected to the projection (6) of the metal base (5), wherein the hole (4) in the board (1) has a constriction (9) situated at a height of 1 to 300 μm from the face surface of the board (1), the projection (6) of the metal base (5) is placed in a wide section (10) of the hole (4), the bonding pads (8) of the chip (7) which are to be grounded are electrically connected to the projection (6) of the metal base (1) through the constricted section (9) of the hole (4), said section being filled with an electrically and heat conducting material (11), while the wide section (10) of the hole (4) is from 0.2×0.2 mm to the size of the chip (7), and the distance between the side walls of the projection (6) and the side walls of the wide section (10) of the hole (4) is 0.001 to 1.0 mm.

2. The microwave hybrid integrated circuit as set forth in claim 1, wherein the hole (4) in the board (1) is metallized.

3. The microwave hybrid integrated circuit as set forth in claim 1, wherein the space confined between the side walls of the projection (6) and the side walls of the hole (4) is filled an electrically and heat conducting material.

* * * * *